United States Patent [19]

Misium

[11] Patent Number: 4,968,894

[45] Date of Patent: Nov. 6, 1990

[54] ELECTRICAL FIELD ENHANCED ELECTRON IMAGE PROJECTOR

[75] Inventor: George R. Misium, Richardson, Tex.

[73] Assignee: Texas Instruments Incorporated, Del.

[21] Appl. No.: 373,375

[22] Filed: Jun. 29, 1989

[51] Int. Cl.$^5$ ............................................ H01J 37/073
[52] U.S. Cl. ................................. 250/492.2; 250/398
[58] Field of Search ................. 250/492.24, 492.2, 398

[56] References Cited

U.S. PATENT DOCUMENTS

| | | | |
|---|---|---|---|
| 3,840,749 | 10/1974 | O'Keeffe et al. | 250/492.24 |
| 3,983,401 | 9/1976 | Livesay | 250/492.24 |
| 4,366,383 | 12/1982 | Sano et al. | 250/492.24 |
| 4,572,956 | 2/1986 | Tojo et al. | 250/492.24 |
| 4,608,332 | 8/1986 | Ward | 430/296 |
| 4,634,874 | 1/1987 | Ward | 250/492.2 |
| 4,652,762 | 3/1987 | Ward | 250/492.2 |
| 4,695,732 | 9/1987 | Ward | 250/492.2 |
| 4,705,956 | 11/1987 | Ward | 250/492.2 |

OTHER PUBLICATIONS

"An Electron Imaging System for the Fabrication of Integrated Circuits", by O'Keefe Vine & Handy, in *Solid-State Electronics*, vol. 12, pp. 841–848, (1969).
"Electron Beam Duplication of Integrated Optical Circuits and Masks", by Fay et al., in *Optics Communications*, vol. 9, No. 4, (1973), pp. 424–426.
"Developments in Electron Image Projection", by Ward, in *J. Vac. Sci. Technol.*, vol. 16, No. 6, pp. 1830–1833, (1979).
"The Magnitude and Significance of Proximity Effects in Electron Image Projector, Defined Layers", by Nicholas et al., in *J. Vac. Sci. Technol. B*, vol. 1, No. 4, (1983), pp. 1020–1022.
"A 1:1 Electron Stepper", by Ward et al., in *J. Vac. Sci. Technol. B.*, vol. 4, No. 1, pp. 89–104, (1986).

*Primary Examiner*—Jack I. Berman
*Assistant Examiner*—Keit T. Nguyen
*Attorney, Agent, or Firm*—Raymond E. Fritz; James T. Comfort; Melvin Sharp

[57] ABSTRACT

An electrical field-enhanced electron image projector (10) is exposed to an electrical field source (26) to induce the emission of electrons (20) which flow across a gap (28) from a pattern (14) of mask (12) to a photoresist layer (18) of a substrate (16). A heat source (22) can be applied to increase the flow of electrons (20) from the pattern (14) to the photoresist layer (18). As the gap (28) distance decreases, the ability of electrons (20) to move from the pattern (14) to the photoresist layer (18) increases.

27 Claims, 1 Drawing Sheet

ELECTRICAL FIELD ENHANCED ELECTRON IMAGE PROJECTOR

TECHNICAL FIELD OF THE INVENTION

This invention relates in general to an electron image projector process and apparatus, and in particular to an electron image projector process and apparatus having an electrical field-enhanced emitting mask for the generation of electrons.

BACKGROUND OF THE INVENTION

The fabrication of integrated circuits has encountered problems due to submicron precision that must be maintained over a microscopic distance for lithographic processes. In the past, lithographic processes have used electron beam scanning. Electron beam scanning controls the electron beam to serially scan over the surface of a silicon wafer to create the desired image. This process typically takes several hours for the single electron beam to scan the entire wafer during fabrication. Generally, excellent resolution flexibility is possible when using single beam instruments; however, the sequential operation can only scan over a limited area. Thus, to scan the entire wafer, a step and repeat sequence must be used with subsidiary alignment markers being picked up in each frame. Throughout most of the fabrication sequence of a typical integrated circuit, a series of fixed and repetitive exposure patterns are required; hence, the process of aligning and serially scanning is time consuming and ineffective for high volume production.

A high resolution electron image projection tube has been investigated as a means for fabricating large arrays of micron size transistors. See T. W. O'Keefe, J. Vine and R. N. Handy, *An Electron Imaging System for the Fabrication of Integrated Circuits*. Solid-state Electron 12, 841 (1969). In an electron image projector, pattern details are transferred from a mask onto a silicon wafer using electrons as carriers of the information. Electron image projectors operate by driving electrons from an air stable photocathode which has a surface containing an image of the desired pattern. Subsequently, coaxial electric fields focus the electron image on the silicon wafer targets.

In operation, the electron image projectors are generally arranged as simple diodes with a wafer as the anode and an electron emitting mask as the cathode. In the prior art, ultraviolet radiation has been used in order to excite the mask to emit electrons. Unfortunately, the cost and complexity of tools using this radiation source are excessive and burdensome.

Despite the advancements in electron image projectors, there have thus been problems associated with the method of activating the electrons to be emitted from the mask. Therefore, a need has arisen for an electron image projector which does not require ultraviolet radiation and which has improved quality control characteristics which will permit electron image projectors to emit electrons with reliability and controllability. Additionally, there is a need for an electron emitting mask which is easy to manufacture, simple to operate and which requires little maintenance.

SUMMARY OF THE INVENTION

In accordance with the present invention, an electrical field enhanced electron image projector is provided which substantially eliminates or reduces the disadvantages and problems associated with prior electron image projectors. Specifically, one aspect of the present invention is an electron projector apparatus which is comprised of a mask for emitting electrons. This mask has an electron emitting pattern formed thereon to create the desired image to be placed onto a photoresist layer of a substrate. Also, the mask is aligned substantially parallel to the substrate to create a gap therebetween. In its preferred embodiment, the gap spacing is between approximately 10,000 angstroms and approximately 50,000 angstroms. In its operation, an electrical field is applied across the mask and the substrate to induce the emission of electrons across the gap from the pattern to the photoresist layer. It has been found that when a field of approximately 1 million volts per centimeter is applied across this gap, electrons will flow to create the desired imaging on the photoresist layer of the substrate. To increase the flow of electrons across the gap, a heat source may be applied to the mask for inducing the emission of electrons from the pattern of the mask to the photoresist layer of the substrate. To enhance the alignment of electrons, a magnetic field can be used in conjunction with the electric field.

In fabricating the electron image projector, a pattern is initially formed on the mask which is preferably tungsten having a specialized layer which will readily emit electrons across the gap. Subsequently, the substrate is aligned substantially parallel to the mask and voltage is applied between the mask and the substrate to accelerate the electrons across the gap.

The present invention has the technical advantages of ease of operation and cost effectiveness because the complexity of the tools used with ultraviolet light activation are no longer necessary. Additionally, it is a technical advantage not to be required to coat the mask with a special light sensitive material which is susceptible to ultraviolet rays.

BRIEF DESCRIPTION OF THE DRAWINGS

Other aspects of the invention and their advantages will be discerned after studying the detailed description in conjunction with the drawings in which.

DETAILED DESCRIPTION OF THE INVENTION

An electron projector functions to pattern a detailed image onto the surface of silicon wafers by utilizing electrons as an imaging device. After the image has been exposed onto the silicon wafer, subsequent steps are used to remove the exposed region from the non-exposed region of the substrate for negative tone resist. The present invention can also be used as a positive tone resist. The present invention deals with a method of exciting the pattern on the mask to induce the flow of electrons from the pattern of the mask to imprint the photoresist with a particular configuration as required by integrated circuitry.

Figure 1:
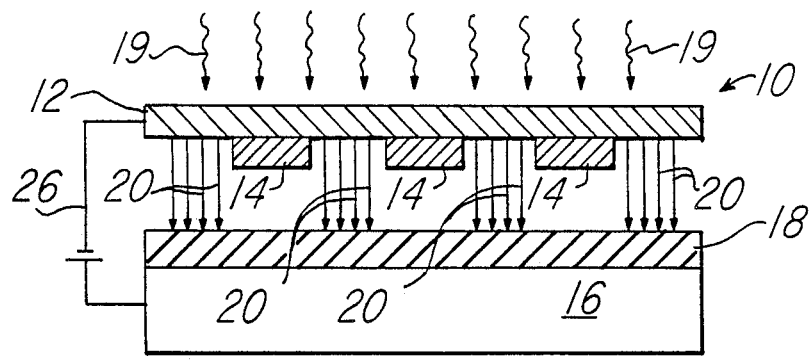
FIG. 1 is an enlarged schematic cross-sectional view an integrated circuit workpiece illustrating the structure of a prior art electron image projector.

Referring to FIG. 1, a prior art electron image projector is shown in an enlarged cross-sectional view and is generally designated 10. Projector 10 comprises a mask 12 which has a pattern 14 formed thereon. The wafer which receives the electron emission can be seen as a substrate 16 which has a photoresist material 18 formed onto one surface of substrate 16. In its operation, a mask 12 is excited by ultraviolet radiation 19 to such a state as to allow electrons to flow from the mask 12 to photoresist 18. An electrical source 26 is applied across mask 12 and substrate 16 to focus the electrons 20 on layer 18. Normally, source 26 generates an electric field on the order of 10,000 volts/cm.

Figure 2:
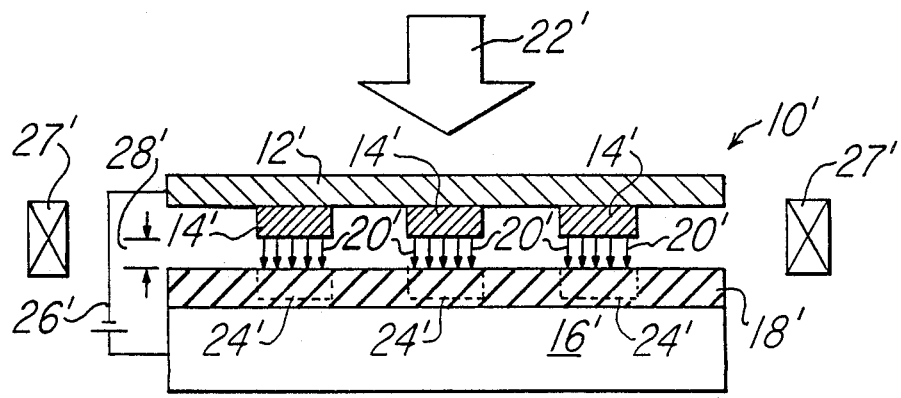
FIG. 2 is an enlarged schematic cross-sectional view of a workpiece shown in FIG. 1, showing a subsequent selective exposure of the photoresist to an electron field source in accordance with the present invention.

In FIG. 2, an electron image projector 10' constructed and operated in accordance with the present invention is illustrated. In this embodiment, mask 12' has a pattern 14' formed thereon as previously described. The mask 12' is closely aligned in parallel to substrate 16' which photoresist material 18' formed thereon. An important aspect of the invention is the connection of an electrical source 26' across mask 12' and substrate 16'. In an alternative embodiment, coils 27' can be incorporated with projector 10' to enhance the alignment of electrons 20' by generating a magnetic field in conjunction with source 26'. Because the substrate 16' acts as an anode and pattern 14' as a cathode, source 26' causes electrons 20' to be emitted from pattern 14' and to impinge upon photoresist material 18'. The space between pattern 14' and photoresist 18' is defined as gap 28'. It is important that gap 28' be sufficiently narrow and source 26' of sufficient magnitude such that an electrical arc is created to cause electrons 20' to easily jump gap 28'.

In an alternative embodiment, in order to increase the rate of emission of electrons 20' from pattern 14' to photoresist layer 18', a heat source 22' can be applied to pattern 14' and mask 12'. When the electrons 20' have contacted photoresist layer 18', a chemical reaction converts photoresist layer 18' to images 24' which are susceptible to subsequent processing steps to adequately etch away images 24' to resemble pattern Still referring to FIG. 2, in its preferred embodiment, mask 12' and substrate 16' are substantially parallel. Mask 12' is preferably made of aluminum which has a relatively high heat transfer coefficient. In its preferred embodiment, pattern 14' is formed of chromium, tungsten, tungsten covered with thorium or tungsten covered with calcium oxide or a mixture of alkaline oxide. The thermal heat transfer coefficient of aluminum in mask 12' and the material used for pattern 14' are substantially the same to avoid stresses which are formed when the temperature increases in the processing. This design consideration thus helps avoid warping of the mask. Not only is it important that the thermal expansion of pattern 14' and mask 12' be essentially the same, but it is also important that there be good heat transfer between mask 12' and pattern 14' to insure that heat source 22' is effectively induced across the entire surface of pattern 14' and mask 12'.

The method of manufacturing mask 12' and pattern 14' is well known in the art. For example, mask 12' may include a layer of aluminum having a tungsten layer formed thereon. An etching process can subsequently cut away the tungsten to form pattern 14' to the desired configuration needed to fabricate the integrated circuit.

Still referring to FIG. 2, in its preferred embodiment, photoresist layer 18' comprises a Novolak TM composition. One such standard Novolak photoresist compound is Shipley 1400 Series Resist. Layer 18' can also comprise other organic photoresist compounds that are etchable by a reactive ion etchant. Substrate 16' is preferably made of aluminum. Satisfactory results have been accomplished by applying a field through source 26' of approximately 1,000,000 volts per centimeter across substrate 16' and mask 12'. Additionally, when using tungsten covered with an alkaline oxide, a temperature of between approximately 120 and approximately 150 degrees centigrade is optimal for inducing the emission of electrons 20' with heat source 22'. Heat source 22' may comprise any suitable source of heat such as a microwave or furnace.

In an alternative embodiment, the space between substrate 16' and mask 12' can be electric field-free by replacing mask 10' with an electrode having spaces therein. Once the substitute electrode has a voltage applied thereto, an electron tunnel will be set up mask 12'. Accordingly, substrate 16' can be separated from mask 12', and an optical system can be placed between mask 12' and substrate 16' to focus electrons 20' from pattern 14 to photoresist 18.

In an alternative embodiment, mask 12' and photoresist layer 18' are separated to form gap 28'. Gap 28' is sufficiently narrowed to cause electric arcing of electrons 20' across gap 28' by moving pattern 14' and photoresist layer 18' towards each other until electrons 20' flow across gap 28'.

The tunneling current emitted by a metal is expressed by the Fowler-Nordheim equation, $$J = CE^2 e^{-D/t}$$

where $C = 1.26 \times 10^5$ A/volt$^2$, $D = 2.76 \times 10^{-10}$ V/m for tungsten, and E = current applied. The basic relationship can be used for this application if the gap 28' between pattern 14' and photoresist layer 18' is reduced to between approximate 10,000 angstroms and 50,000 angstroms and the field applied is 1,000,000 V/cm.

Figure 3:
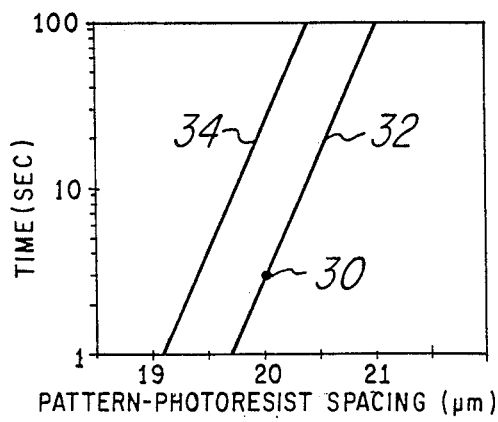
FIG. 3 is a graph showing the relationship of time versus distance between the pattern of the mask and the photoresist layer of the substrate in the present invention.

FIG. 3 is a plot pursuant to the above equation of the exposure time required to expose a typical substrate as a function of the separation of gap 28' between pattern 14' and photoresist layer 18'. Reasonable exposure times can be obtained for practical separations of gap 28' between pattern 14' and photoresist layer 18'. For example, the exposure time can be accomplished in 3 seconds for a pattern-photoresist gap spacing of approximately 20,000 angstroms as indicated by point 30. Point 30 is obtained from a line 32 which represents a photoresist layer 18' having a thickness of approximately 7000 angstroms. Similarly, a line 34 represents photoresist layer 18' having a thickness of approximately 15,000 angstroms. Accordingly, the thickness of photoresist layer 18' is proportional to the time of exposure.

In summary, an advantageous electron image projector has been disclosed that features the use of an electrical field enhanced mask emitting source for inducing the electron flow to the photoresist layer of a substrate. The process of the invention has significant advantages over the prior art in terms of high resolution, increased throughput, better uniformity, and reduced complexity.

While the preferred embodiment of the present invention and their advantages have been disclosed in the above detailed description, the invention is not limited thereto but only by the spirit and scope of the appended claims.

What is claimed is:

1. An electron image projecting apparatus for emitting electrons from a mask to a photoresist layer of a substrate, which comprises:
   a pattern formed adjacent to the mask and aligned substantially parallel to said photoresist layer to form a gap therebetween; and
   an electric field source applied across said pattern and the substrate, said source being of sufficient magnitude for inducing the emission of electrons from said pattern to the photoresist layer.

2. The apparatus of claim 1, wherein said gap is between approximately 10,000 angstroms and approximately 50,000 angstroms in width.

3. The apparatus of claim 1, further comprising a heat source applied to said mask for increasing the rate of emission of electrons from the pattern to the photoresist layer.

4. The apparatus of claim 1, wherein said pattern is selected from the group of chromium, tungsten, molybdenum and a combination thereof.

5. The apparatus of claim 1, wherein the mask comprises aluminum.

6. The apparatus of claim 3, wherein said heat source is applied to the mask for transferring heat to said pattern.

7. The apparatus of claim 1, wherein said photoresist layer comprises a Novalok TM composition.

8. The apparatus of claim 1, wherein said electric field source is approximately 1 million volts per centimeter.

9. The apparatus of claim 3, wherein said heat applied to said pattern raises the temperature to between approximately 120 and approximately 150 degrees centigrade.

10. The apparatus of claim 1, wherein said mask and said pattern have substantially the same thermal expansion coefficient.

11. The apparatus of claim 1, further comprising coils incorporated in the apparatus for enhancing the alignment of electrons by generating a magnetic field in conjunction with said electric field source.

12. An electron image projecting apparatus for emitting electrons, which comprises:
   a mask;
   an electron emitting metal pattern formed on said mask to create an image;
   a substrate aligned substantially parallel to said mask such that said pattern faces said substrate to form a gap therebetween;
   a photoresist layer formed on said substrate; and
   an electric field source applied across said pattern and said substrate for inducing the emission of electrons across said gap from said pattern to said photoresist layer.

13. The apparatus of claim 12, further comprising a heat source applied to said mask for increasing the rate of emission of the flow of electrons from said pattern to said photoresist layer.

14. The apparatus of claim 12, wherein said pattern is selected from the group of chromium, tungsten, molybdenum and a combination thereof.

15. The apparatus of claim 12, wherein said mask comprises aluminum.

16. The apparatus of claim 12, wherein said photoresist comprises Novolak TM composition.

17. The apparatus of claim 12, wherein said electric field source applied across said substrate and said mask is approximately 1 million volts per centimeter.

18. The apparatus of claim 13, wherein said heat source applied raises the said pattern temperature to between approximately 120 and 150 degrees centigrade.

19. The apparatus of claim 12, wherein said mask and said pattern have substantially the same thermal expansion coefficient.

20. An electron image projecting process for emitting electrons from a pattern formed on a mask to a photoresist of a substrate comprising the steps of:
   applying an electric field between the substrate and the mask of sufficient magnitude to induce the emission of electrons from said pattern to the photoresist; and
   directing the electrons to the photoresist.

21. The process of claim 20, further comprising the step of heating the pattern on the mask to increase the rate of emission of electrons from the pattern to the photoresist layer.

22. The process of claim 20, further comprising the steps of separating said mask and said photoresist by a gap sufficiently narrow to cause an arcing of the electrons across said gap by moving the pattern and the photoresist layer towards each other until the electrons flow across the gap formed therebetween.

23. The process of claim 20, wherein the mask and the pattern have relatively the same thermal expansion coefficient.

24. An electron image projecting process for emitting electrons from a pattern on a mask to a photoresist layer of a substrate comprising the steps of:
   forming an electron emitting pattern on the mask;
   aligning the substrate substantially parallel to the mask to form a gap therebetween; and
   applying an electric field between the substrate and the mask of a sufficient level to induce the emission of electrons across the gap from said pattern to the photoresist layer.

25. The process of claim 24 further comprising the step of heating the mask to increase the rate of emission of electrons from the pattern to the photoresist layer across the gap.

26. The process of claim 24, wherein the mask and the pattern have relatively the same thermal expansion coefficient.

27. The process of claim 24, wherein the pattern and the photoresist layer are 20,000 angstroms apart.

* * * * *